(12) United States Patent
Djordjevic et al.

(10) Patent No.: US 8,234,549 B2
(45) Date of Patent: Jul. 31, 2012

(54) SIMULTANEOUS PMD COMPENSATION AND CHROMATIC DISPERSION COMPENSATION USING LDPC CODED OFDM

(75) Inventors: Ivan Djordjevic, Tucson, AR (US); Ting Wang, Princeton, NJ (US); Lei Xu, Princeton, NJ (US); Milorad Cvijetic, Herndon, VA (US)

(73) Assignee: NEC Laboratories America, Inc., Princeton, NJ (US)

( * ) Notice: Subject to any disclaimer, the term of this patent is extended or adjusted under 35 U.S.C. 154(b) by 1161 days.

(21) Appl. No.: 12/043,348

(22) Filed: Mar. 6, 2008

(65) Prior Publication Data

US 2009/0228766 A1  Sep. 10, 2009

(51) Int. Cl.
*H03M 13/03* (2006.01)
*H03M 13/00* (2006.01)

(52) U.S. Cl. .................. 714/780; 714/794; 714/795

(58) Field of Classification Search .......... 714/780, 714/794, 795
See application file for complete search history.

(56) References Cited

U.S. PATENT DOCUMENTS

| | | | | |
|---|---|---|---|---|
| 5,400,165 A * | 3/1995 | Gnauck et al. | ............... | 398/160 |
| 5,604,618 A * | 2/1997 | Mori et al. | ................... | 398/150 |
| 5,887,035 A * | 3/1999 | Molnar | ......................... | 375/340 |
| 6,518,892 B2 * | 2/2003 | Shen et al. | ...................... | 341/50 |
| 6,757,337 B2 * | 6/2004 | Zhuang et al. | ............... | 375/267 |
| 6,829,308 B2 * | 12/2004 | Eroz et al. | ...................... | 375/271 |
| 7,107,511 B2 * | 9/2006 | Shen et al. | ..................... | 714/794 |
| 7,133,135 B2 * | 11/2006 | Dorrer | ......................... | 356/450 |
| 7,398,453 B2 * | 7/2008 | Yu | ................................. | 714/778 |
| 7,602,838 B2 * | 10/2009 | Bottomley et al. | ........... | 375/148 |
| 7,738,578 B2 * | 6/2010 | Ktenas et al. | ................. | 375/260 |
| 7,746,951 B2 * | 6/2010 | Hwang et al. | ................ | 375/267 |
| 7,895,503 B2 * | 2/2011 | Walton et al. | ................. | 714/774 |
| 7,912,140 B2 * | 3/2011 | Anholt et al. | ................. | 375/262 |
| 2006/0198454 A1 * | 9/2006 | Chung et al. | ................. | 375/260 |
| 2007/0127589 A1 * | 6/2007 | Hwang et al. | ................ | 375/267 |
| 2008/0019331 A1 * | 1/2008 | Thomas et al. | ............... | 370/338 |
| 2008/0109701 A1 * | 5/2008 | Yu et al. | ....................... | 714/760 |

OTHER PUBLICATIONS

Lowery, A.J. et al., "Orthogonal Frequency Division Mutliplexing for Adaptive Dispersion Compensation in Long Haul WDM Systems", Proc. OFC Postdeadline Papers, Paper No. PDP39, 2006.
Shieh, W., "PMD-supported Coherent Optical OFDM Systems", IEEE Photonics Technol. Lett. 19, 134-136, 2006.

* cited by examiner

Primary Examiner — Joseph D Torres
(74) Attorney, Agent, or Firm — Joseph Kolodka

(57) ABSTRACT

A method includes estimating quadrature amplitude modulated QAM symbols in an LDPC encoded OFDM signal for transmission, performing channel estimation by training sequence to determine channel coefficients in reception of the LDPC encoded OFDM signal; and obtaining channel information detection and decoding of the LDPC encoded signal.

16 Claims, 4 Drawing Sheets

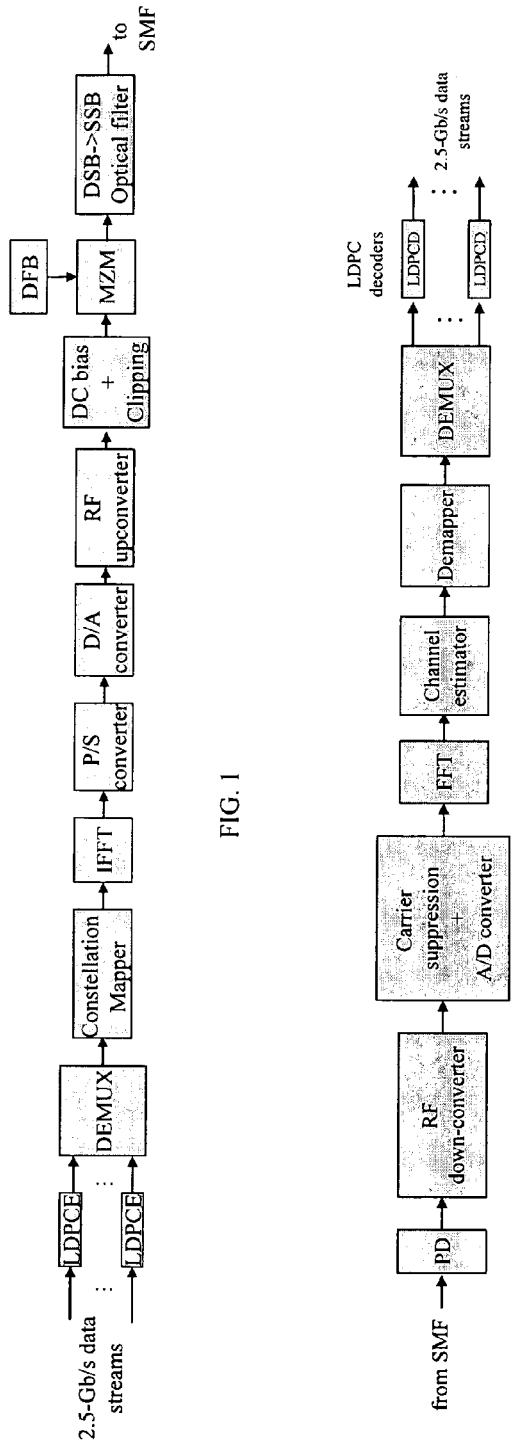
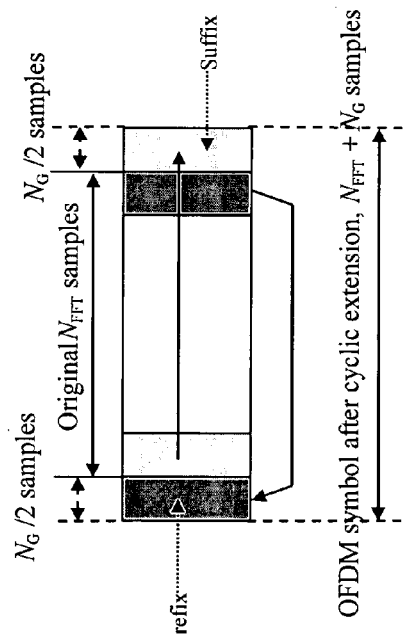
FIG. 1
FIG. 2
FIG. 3

SIMULTANEOUS PMD COMPENSATION AND CHROMATIC DISPERSION COMPENSATION USING LDPC CODED OFDM

BACKGROUND OF THE INVENTION

The present invention relates generally to optical communications, and more particularly, to a technique for simultaneous polarization mode dispersion compensation and chromatic dispersion compensation using LDPC coded OFDM.

BACKGROUND OF THE INVENTION

The performance of fiber-optics communication systems operating at high-speed are degraded significantly due to several transmission impairments including intrachannel and interchannel fiber nonlinearities, Gordon-Mollenauer effect and polarization-mode dispersion (PMD). The PMD is a quite challenging impairment to compensate due to its time variant and stochastic nature.

Orthogonal frequency division multiplexing OFDM is a special case of multi-carrier transmission in which a single information-bearing stream is transmitted over many lower rate sub-channels, and has already been used or proposed for a variety of applications including digital audio broadcasting, high-definition television (HDTV) broadcasting, high bit-rate digital subscriber line (DSL), IEEE 802.11, radio-over-fiber-based links, free-space optical communications, long-haul optical communications systems, multimode fiber links, and 100-Gb/s Ethernet. Due to orthogonality among sub-carriers in OFDM, partial overlap of neighboring frequency slots is allowed, thereby improving spectral efficiency as compared with a conventional multi-carrier system. Also, by using a sufficiently large number of sub-carriers and cyclic extension, the intersymbol interference (ISI) due to PMD can be reduced.

It has been shown that a low-density parity-check (LDPC)-coded turbo equalizer is able to successfully tackle the differential group delay (DGD) up to two bit-periods and residual chromatic dispersion over 700 km of SMF for reasonable trellis complexity of the Bahl-Cocke-Jelenik-Raviv (BCJR) equalizer. However, for DGDs above two-bit periods and longer SMF lengths the complexity of BCJR equalizer is prohibitively high for high-speed implementation, and an alternative approach is needed.

Accordingly, there is a need for simultaneous polarization-mode dispersion (PMD) and chromatic dispersion compensation for noncoherent fiber-optics communication systems that overcomes the limitations of current compensation techniques.

SUMMARY OF THE INVENTION

A method according to the invention includes estimating quadrature amplitude modulated QAM symbols in an LDPC encoded OFDM signal for transmission; performing channel estimation to determine channel coefficients in reception of the LDPC encoded OFDM signal; and obtaining channel information detection and decoding of the LDPC encoded signal. In a preferred embodiment, the estimated QAM symbols are related to channel distortion introduced by PMD, phase shift of the QAM symbols due to chromatic dispersion and self-phase modulation.

In accordance with another aspect of the invention, there is provided a method that includes performing channel estimation to determine channel coefficients in a receiver of a fiber optic communication system using LDPC coded OFDM; estimating QAM symbols in a transmitter of the communication system; and obtaining channel information for detection and decoding in the communication system.

BRIEF DESCRIPTION OF DRAWINGS

These and other advantages of the invention will be apparent to those of ordinary skill in the art by reference to the following detailed description and the accompanying drawings.

FIG. 1 is a block diagram of an exemplary transmitter configuration of an optical communication system helpful for explaining of the invention.

FIG. 2 is a block diagram of an exemplary receiver configuration for use with the transmitter of FIG. 1, helpful for explaining the invention.

FIG. 3 is a diagram of an orthogonal frequency division multiplexing OFDM symbol after cyclic extension.

DETAILED DESCRIPTION

Figure 4:
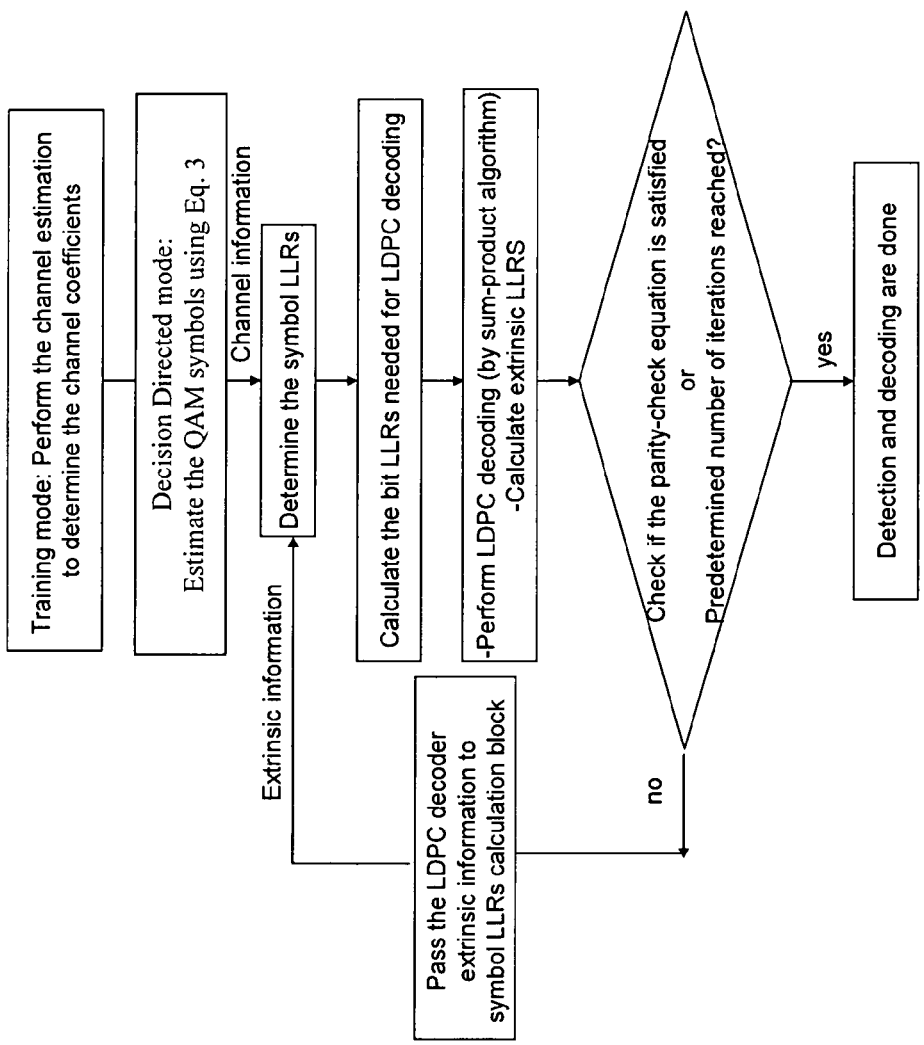
FIG. 4 is a flow diagram of channel estimation based on training sequence for simultaneous PMD and chromatic dispersion compensation using LDPC coding, in accordance with the invention.

The inventive polarization-mode dispersion (PMD) compensation method for noncoherent fiber-optics communication systems is based on a channel estimation technique and low-density parity-check (LDPC)-coded orthogonal frequency division multiplexing (OFDM). With the inventive method, for a differential group delay (DGD) of 4/BW (BW is the OFDM signal bandwidth) the degradation due to PMD, in thermal noise dominated scenario, can be completely compensated for. A LDPC-coded turbo equalization solution is not practical at all for this amount of DGD because the number of states required in a BCJR equalizer is too high. In amplified spontaneous emission (ASE) dominated scenario the accumulated dispersion over 6500 km and DGD of 100 ps can be simultaneously compensated with penalty within 1.5 dB (with respect to a back-to-back configuration). Two classes of LDPC codes designed disclosed on two different combinatorial objects (difference systems and product of combinatorial designs) suitable for use in the inventive PMD compensation method.

Referring now to FIGS. 1 and 2, exemplary transmitter and receiver configurations for illustrating use of the invention are shown in FIGS. 1 and 2, respectively. The diagram of FIG. 3 illustrates the OFDM symbol after cyclic extension is shown in FIG. 3. Some of the notations used are LDPCE for a low density parity-check LDPC encoder, LDPCD for a low density parity-check LDPC decoder, P/S for a parallel-to-serial converter, MZM for a Mach-Zehnder modulator and D/A for digital-to-analog, FFT for fast Fourier transform, IFFT for inverse fast Fourier transform and PD is for photodetector, DSB for double sideband, and SSB for single sideband.

An information-bearing stream at 10 Gb/s is demultiplexed into four 2.5-Gb/s streams, which are further encoded using identical LDPC codes. This step is determined by currently existing LDPC chips. The outputs of LDPC encoders are demultiplexed and parsed into groups of $b_s$ bits corresponding to the OFDM symbol. The $b_s$ bits in each OFDM symbol are subdivided into K sub-channels with $i^{th}$ sub-carrier carrying $b_i$ bits, $b_s=\Sigma b_i$. The $b_i$ bits from the $i^{th}$ sub-channel are mapped into a complex-valued signal from a $2^{b_i}$-point signal constellation such as QAM, which is considered in this application, using Gray mapping. For example, $b_i=2$ for QPSK and $b_i=4$ for 16-QAM. The complex-valued signal points from sub-channels are considered to be the values of the discrete Fourier transform (DFT) of a multi-carrier OFDM signal. By selecting the number of sub-channels K, sufficiently large, the OFDM symbol interval can be made significantly larger than the dispersed pulse-width of an equivalent single-carrier system, resulting in significantly reduced ISI due to PMD and chromatic dispersion. For complete elimination of ISI, the total delay spread due to chromatic dispersion and DGD should be smaller than the guard time.

After a D/A conversion and RF up-conversion, the RF signal can be converted to optical domain using one of two possible options: (i) the OFDM signal can directly modulate the distributed feedback laser (DFB) laser, and (ii) the OFDM signal can be used as RF input of the Mach-Zehnder modulator (MZM). The DC bias component must be inserted to enable recovering the QAM symbols incoherently. Because bipolar signals cannot be transmitted over an IM/DD link, it is assumed that the bias component is sufficiently large so that when added to the OFDM signal the resulting sum is non-negative. The main disadvantage of scheme (i) is the poor power efficiency. To improve the power efficiency we can use the single-side band (SSB) transmission, and employ the clipping of the OFDM signal after bias addition. However, the clipping introduces the distortion of OFDM signal. To avoid distortion due to clipping we propose to transmit the information signal by modulating the electrical field (instead of intensity modulation) using an MZM so that negative part of OFDM signal can be transmitted towards the photodetector. Distortion introduced by the photodetector, caused by squaring, can be successfully eliminated by proper filtering. The bias is varied to find the optimum one for fixed optical launched power. It was found that the optimum case is one in which ~50% of the total electrical signal energy is allocated for transmission of a carrier.

The photodiode output signal i(t), after appropriate filtering to remove the squared and DC terms, in the presence of the first order PMD is proportional to $$i(t) \Box 2Rb[k \cdot s_{OFDM}(t-\Delta\tau/2)+(1-k) \cdot s_{OFDM}(t+\Delta\tau/2)], \quad (1)$$

Where R is the photodiode responsivity, k is the power splitting ration between principal states of polarization (PSPs), b is the DC bias, $\Delta\tau$ is the differential group delay, and $s_{OFDM}$ is the OFDM signal.

The received QAM symbol of i-th subcarrier of the k-th OFDM symbol is related to transmitted QAM symbol $X_{i,k}$ by $$Y_{i,k}=h_i e^{j\theta_i} e^{j\phi_k} X_{i,k}+n_{i,k}, \quad (2)$$

where $h_i$ is channel distortion introduced by PMD and chromatic dispersion, and $\theta_i$ is the phase shift of i-th sub-carrier due to chromatic dispersion. $\phi_k$ represents the OFDM symbol phase noise due to SPM and RF down-converter, and can be eliminated by pilot-aided channel estimation. Notice that in direct detection case, the laser phase noise is completely cancelled by photodetection. To estimate the channel distortion due to PMD $h_i$ and phase shift due to chromatic dispersion $\theta_i$, we need to pre-transmit the training sequence. In ASE noise dominated scenario the channel estimates are sensitive to ASE noise, the training sequence should be sufficiently long to average the noise.

In a decision-directed mode the transmitted QAM symbols are estimated by $$\hat{X}_{i,k} = (h_i^*/|h_i|^2)e^{-j\theta_i}e^{-j\phi_k}Y_{i,k}. \quad (3)$$

The symbol LLRs $\lambda(q)$ (q=0, 1, ..., $2^b-1$) can be determined by $$\lambda(q) = \frac{(\text{Re}[\hat{X}_{i,k}] - \text{Re}[QAM(\text{map}(q))])^2}{N_0} - \frac{(\text{Im}[\hat{X}_{i,k}] - \text{Im}[QAM(\text{map}(q))])^2}{N_0}; \quad (4)$$

$$q = 0, 1, \ldots, 2^b - 1$$

where Re[ ] and Im[ ] denote the real and imaginary part of a complex number, QAM denotes the QAM-constellation diagram, $N_0$ denotes the power-spectral density of an equivalent Gaussian noise process obtained from training sequence, and map(q) denotes a corresponding mapping rule (Gray mapping is applied here). (b denotes the number of bits per constellation point.)

Bit LLRs needed for LDPC decoding are calculated from symbol LLRs by $$L(\hat{v}_j) = \log \frac{\sum_{q:v_j=0} \exp[\lambda(q)]}{\sum_{q:v_j=1} \exp[\lambda(q)]}, \quad (5)$$

Therefore, the jth bit reliability is calculated as the logarithm of the ratio of a probability that $v_j=0$ and probability that $v_j=1$. In the nominator, the summation is done over all symbols q having 0 at the position j, while in the denominator over all symbols q having 1 at the position j.

Figure 5B:
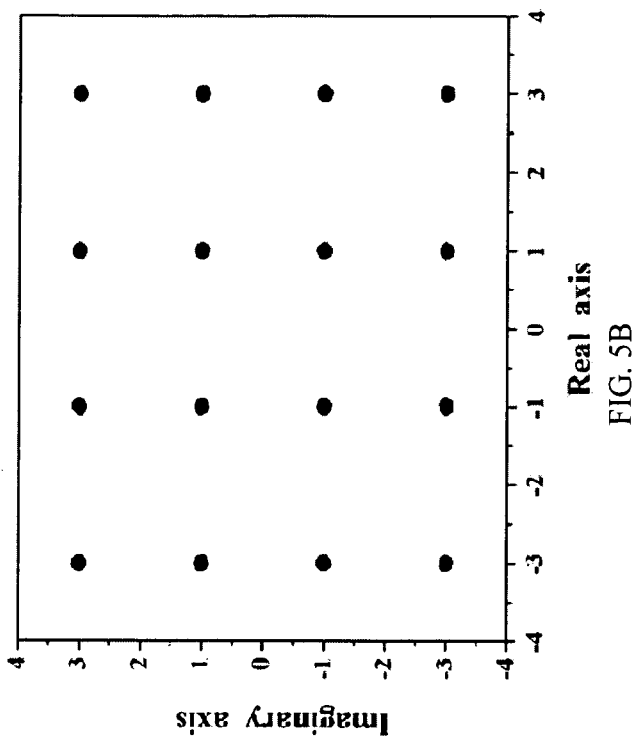
FIGS. 5A and 5B are constellation diagrams before and after channel estimation (based on training sequence), respectively, in accordance with the invention (only PMD effect is included).
Figure 5A:
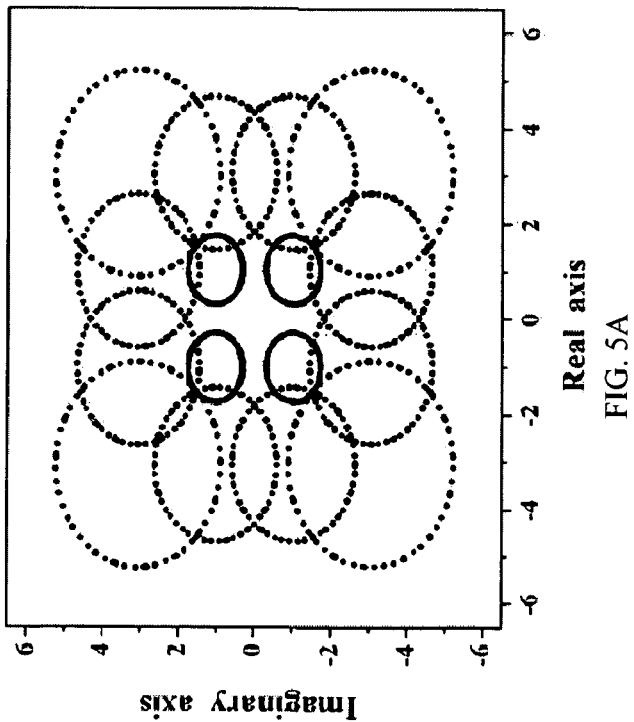

To illustrate the validity of this approach in suppression of the first order PMD we performed a simulation for thermal noise dominated scenario, for OFDM system parameters given in FIGS. 5A and 5B, by employing 16-QAM-OFDM SSB transmission in the absence of noise. The signal constellation diagrams before and after channel estimation for DGD of 4/BW (BW—the OFDM signal bandwidth) are given in FIG. 5A and FIG. 5B, respectively. Obviously, the PMD distortion can be completely eliminated by using a simple training sequence. An LDPC-coded turbo equalization scheme noted above requires the channel trellis with too many states to be of practical importance for this amount of DGD. It is also that OFDM alone has already been recently considered for coherent optical communication systems. However, such a solution requires the use of an additional local laser, and a polarization tracking or polarization diversity receiver increasing the receiver complexity. Also the state-of-the art optical communication systems already installed are essentially IM/DD systems, making the inventive PMD compensation technique timely and much less expensive to implement.

The channel estimator block output samples, see FIG. 2, are used to estimate the bit reliabilities in a demapper block, which are further demultiplexed and fed to identical LDPC iterative decoders LDPC implemented using sum-product algorithm.

The FIGS. 5A and 5B constellation diagrams, for thermal noise dominated scenario, show before (5A), and after (5B) channel estimation by using the training sequence for DGD equal to 4/BW (BW is OFDM signal bandwidth), and k=½ in the absence of noise. The OFDM signal bandwidth is set to BW=0.25 B (B—is the aggregate bit rate set to 10 Gb/s), the number of sub-channels is set to $N_{QAM}$=64, FFT/IFFT is calculated in $N_{FFT}$=128 points, RF carrier frequency is set to 0.75 B, the bandwidth of optical filter for SSB transmission is set to 2 B, and the total averaged launched power is set to 0 dBm. The guard interval is obtained by cyclic extension of $N_G$=2×16 samples.

Figure 6:
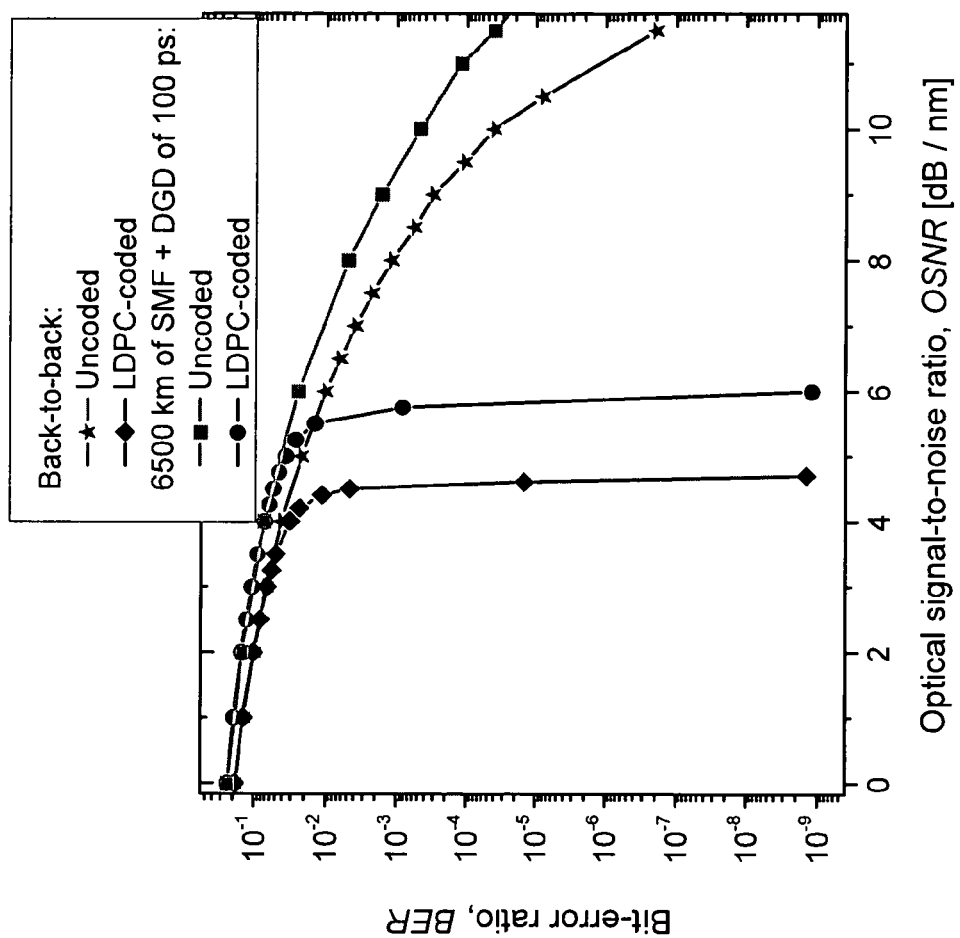
FIG. 6 represents BER performance of LDPC-coded OFDM system with aggregate rate of 10 Gb/s, after 6500 km of SMF and for DGD of 100 ps, in ASE noise dominated scenario.

In FIG. 6 the efficiency of LDPC-coded OFDM in simultaneous chromatic dispersion and PMD compensation, under ASE noise dominated scenario, is studied. After 6500 km of SMF (without optical dispersion compensation) and for DGD of 100 ps, the LDPC-coded OFDM has the penalty within 1.5 dB. Notice that coded turbo equalization cannot be used at all for this level of residual chromatic dispersion and DGD. It can also be noticed that, from numerical results presented here, that the major factor of performance degradation in LDPC-coded OFDM with direct detection is PMD. To improve the tolerance to PMD someone may use longer training sequences, or to use the polarization beam splitter and separately process x- and y-PSPs, in a fashion similar to that proposed for OFDM with coherent detection; however, the complexity of such a scheme would be at least two times higher.

Two classes of high-rate LDPC codes are proposed, based on Theorems 1 and 2 below.

Theorem 1. If 20t+1 is a prime or a prime power, and θ is a primitive root of GF(20t+1), the following t initial sets $S_0=(\theta^0, \theta^{4t}, \theta^{8t}, \theta^{12t}, \theta^{16t})$, $S_2=(\theta^2, \theta^{4t+2}, \theta^{8t+2}, \theta^{12t+2}, \theta^{16t+2})$, ..., $S_{2t}=(\theta^{2t-2}, \theta^{6t-2}, \theta^{10t-2}, \theta^{14t-2}, \theta^{18t-2})$ form a difference system with following parameters v=20t+1, k=5, λ=1

The number of blocks in this difference system is b=t(20t+1). The corresponding LDPC code has the length N=t(20t+1), the number of parity bits N−K=20t+1, the code rate is lower bounded by R≧1−1/t, and the girth is at least six.

Theorem 2. Let us observe the product of P 1-configurations (see Definition 1 below) denoted by 2-($v_i,k_i$,{0,1}) (i=1, ..., P). By identifying the integers in every block of a product configuration obtained as explained in Definition 2 below as positions of ones in corresponding rows in a block-element incident matrix, we can establish 1-to-1 correspondence between a block-element incident matrix and a parity-check matrix of an equivalent LDPC code. An LDPC code such obtained has the girth of at least 6, the codeword length is $v_1 v_2 \ldots v_P$, and the code rate is lower bounded by R≧1−$\lfloor b_1/k_1 \rfloor \cdot \ldots \cdot \lfloor b_P/k_P \rfloor / (v_1 v_2 \ldots v_P)$.

Definition 1. A λ-configuration, denoted as t-(v,k,{0, 1, ..., λ}), is a collection of k-subsets (blocks) of a v-set V such that every t-subset of V is contained in at most λ of the blocks.

Definition 2. Let $\lambda_1$- and $\lambda_2$-configurations, denoted as t-($v_1,k_1$,{0, 1, ..., $\lambda_1$}) and t-($v_2,k_2$,{0, 1, ..., $\lambda_2$}), be given. Denote the number of blocks in $\lambda_1$- and $\lambda_2$-configurations by $b_1$ and $b_2$, respectively; and the corresponding set of blocks by $B_1$ and $B_2$, respectively. The $v_1 v_2$-elements in the product configuration are ordered pair of elements ($e_1,e_2$), with $e_1$ belonging to $B_1$ and $e_2$ belonging to $B_2$. b=$\lfloor b_1/k_1 \rfloor \cdot \lfloor b_2/k_2 \rfloor$ blocks of a product configuration are obtained as follows (with $\lfloor \ \rfloor$ we denoted the largest integer less than or equal to the enclosed quantity). Let the blocks from $B_1$ be grouped into $\lfloor b_1/k_1 \rfloor$ classes of $k_1$ blocks each. The first block in a product configuration is obtained as a $k_1 k_2$-block of ordered pair of elements (($\alpha_1,\beta_1$), ..., ($\alpha_1,\beta_{k2}$), ..., ($\alpha_{k1},\beta_1$), ..., ($\alpha_{k1},\beta_{k2}$)), with $\alpha_i$ (i=1, ..., $k_1$) belonging to the first block of $B_1$, and $\beta_i$ (i=1, ..., $k_2$) belonging to the first block in $B_2$. The first class in product design is obtained by taking one block from the first class in $B_1$ at the time, and one block in $B_2$ out of the first $k_2$ blocks, and create a product block as explained above. The second class in product design is obtained by observing next $k_1$ blocks in $B_1$, and next $k_2$ blocks in $B_2$. The procedure is repeated until all blocks in either $B_1$ or $B_2$ are exploited, or b blocks are generated. The blocks already used in creating the previous product blocks are excluded from further consideration. The product of P configurations can be defined iteratively by taking the product of two configurations in each step.

To increase to girth of LDPC codes designed using the Theorems 1 and 2, certain blocks from λ-configuration or product configuration are to be removed. The algorithm to design large girth is to remove the minimum number of blocks such that girth 8 or 10 is obtained.

Example

Let us observe the product of a (6,2,{0,1}) configuration composed of set of blocks $B_1$={{1,4}, {2,5}, {3,6}, {1,5}, {2,6}, {3,4}, {1,6}, {2,4}, {3,5}} with itself. The resulting product configuration has $v_1 v_2 = v^2$=36 elements (1,1), ..., (1,6), ..., (6,1), ..., (6,6); there are b=($\lfloor b/k \rfloor)^2$=16 blocks, and each of the block is of size $k^2$=4. By listing the two-dimensional elements (1,1), ..., (6,6) as integers 1, 2, ..., 36 the resulting product configuration (36,4,{0,1}) has the following blocks:
B={{1,4,19,22}, {2,5,20,23}, {7,10,25,28}, {8,11,26,29}, {15,18,33,36}, {13,17,31,35}, {3,6,27,30}, {1,5,25,29}, {8,12,32,36}, {9,10,33,34}, {14,18,20,24}, {15,16,21,22}, {1,6,31,36}, {2,4,32,34}, {7,12,19,24}, {8,10,20,22}}
In this example the codeword length is $v_1 v_2$=36, the number of parity bits b=$\lfloor b_1/k_1 \rfloor \cdot \lfloor b_2/k_2 \rfloor$=16, and the girth of corresponding bipartite graph is 8.

Referring now to FIG. 4, there is shown a diagram outlining the key transmitter and receiver steps for the inventive PMD compensation in an LDPC coded OFDM system. Initially, channel estimation by training sequence is performed to determine the channel coefficients on the receiver side. On the receiver side, the QAM symbols are estimated using equation 3. Channel information is undertaken by first determining the symbol least loaded routings LLRs. The LLRs needed for LDPC decoding are calculated, an LDPC decoding is performed by a sub-product process and extrinsic LLRs are calculated. If the parity-check equation is satisfied or if a predetermined number of iterations have been reached, detection and decoding are done. If neither the parity-check equation is satisfied nor a predetermined number of iterations have been reached, the LDPC decoder extrinsic information is passed to symbol LLRs calculation block.

The present invention is an excellent PMD compensator composed of a channel estimator and LDPC-coded orthogonal frequency division multiplexing (OFDM). A simple channel estimation technique, based on a short training sequence, is able completely to compensate PMD for DGD 4/BW (BW—the OFDM signal bandwidth) in LDPC-coded OFDM systems, in thermal noise dominated scenario. An alternative scheme based on an LDPC-coded turbo equalizer requires significant increase in BCJR equalizer complexity to deal with this amount of differential-group delay (DGD).

In ASE noise dominated scenario, the proposed scheme is able to compensate simultaneously the residual chromatic dispersion over 6500 km of SMF and DGD of 100 ps with penalty within 1.5 dB.

The present invention has been shown and described in what are considered to be the most practical and preferred embodiments. It is anticipated, however, that departures may be made therefrom and that obvious modifications will be implemented by those skilled in the art. It will be appreciated that those skilled in the art will be able to devise numerous arrangements and variations, which although not explicitly shown or described herein, embody the principles of the invention and are within their spirit and scope.

What is claimed is:

1. A method comprising the steps of:
estimating quadrature amplitude modulated QAM symbols in an LDPC encoded OFDM signal for transmission;
performing channel estimation to determine channel estimates in reception of the LDPC encoded OFDM signal; and
obtaining channel information for use in detection and decoding of the LDPC encoded signal, wherein the estimated QAM symbols are related to the channel distortion introduced by fiber optical signals, phase shift of the QAM symbols due to chromatic dispersion and self-phase modulation and wherein a $\lambda$-configuration, denoted as $t$-$(v,k,\{0, 1, \ldots \lambda\})$, is a collection of k-subsets (blocks) of a v-set V such that every t-subset of V is contained in at most $\lambda$ of the blocks and let $\lambda_1$- and $\lambda_2$-configurations, denoted as $t$-$(v_1,k_1,\{0, 1, \ldots, \lambda_1\})$ and $t$-$(v_2,k_2,\{0, 1, \ldots, \lambda_2\})$ be given, denote the number of blocks in $\lambda_1$- and $\lambda_2$-configurations by $b_1$ and $b_2$, respectively; and the corresponding set of blocks by $B_1$ and $B_2$, respectively, the $v_1v_2$-elements in the product configuration are ordered pair of elements $(e_1,e_2)$, with $e_1$ belonging to $B_1$ and $e_2$ belonging to $B_2$, $b=\lfloor b_1/k_1 \rfloor \cdot \lfloor b_2/k_2 \rfloor$ blocks of a product configuration are obtained as follows, with $\lfloor \ \rfloor$ denoted the largest integer less than or equal to the enclosed quantity, let the blocks from $B_1$ be grouped into $\lfloor b_1/k_1 \rfloor$ classes of $k_1$ blocks each, the first block in a product configuration is obtained as a $k_1k_2$-block of ordered pair of elements $((\alpha_1,\beta_1), \ldots, (\alpha_1, \beta_{k2}), \ldots, (\alpha_{k1},\beta_1), \ldots, (\alpha_{k1},\beta_{k2}))$, with $\alpha_i$ ($i=1, \ldots, k_1$) belonging to the first block of $B_1$, and $B_i$ ($i=1, \ldots, k_2$) belonging to the first block in $B_2$ and the LDPC encoding comprises a first class code rate obtained by taking one block from the first class in $B_1$ at the time and one block in $B_2$ out of the first $k_2$ blocks and creating a product block.

2. The method of claim 1, further comprising the step of estimating bit reliabilities of a demapping of the received encoded OFDM signal.

3. The method of claim 1, wherein the step of obtaining channel information comprises determining bit log-likelihood ratios for LDPC decoding.

4. The method of claim 1, wherein the step of obtaining channel information comprises determining bit log-likelihood ratios for LDPC decoding and calculating extrinsic log-likelihood ratios.

5. The method of claim 1, wherein the step of obtaining channel information comprises i) determining bit log-likelihood ratios for LDPC decoding and ii) calculating extrinsic log-likelihood ratios till one of a parity check equation is satisfied and a predetermined number of iterations of i) and ii) have occurred.

6. The method of claim 5, comprising the step of using LDPC decoder extrinsic information for symbols log-likelihood ratios determination when one of a parity check equation is unsatisfied and a predetermined number of iterations of i) and ii) have not occurred.

7. A method comprising:
estimating quadrature amplitude modulated QAM symbols in an LDPC encoded OFDM signal for transmission;
performing channel estimation to determine channel estimates in reception of the LDPC encoded OFDM signal; and
obtaining channel information for use in detection and decoding of the LDPC encoded signal, wherein $\lambda$-configuration, denoted as $t$-$(v,k,\{0, 1, \ldots, \lambda\})$, is a collection of k-subsets (blocks) of a v-set V such that every t-subset of V is contained in at most $\lambda$ of the blocks and let $\lambda_1$ and $\lambda_2$ configurations, denoted as $t$-$(v_1,k_1,\{0, 1, \ldots, \lambda_1\})$ and $t$-$(v_2,k_2,\{0, 1, \ldots, \lambda_2\})$, be given, denote the number of blocks in $\lambda_1$ and $\lambda_2$-configurations by $b_1$ and $b_2$, respectively; and the corresponding set of blocks by $B_2$ and $B_2$, respectively, the $v_1v_2$-elements in the product configuration are ordered pair of elements $(e_1,e_2)$, with $e_1$ belonging to $B_1$ and $e_2$ belonging to $B_2$, $b=\lfloor b_1/k_1 \rfloor \cdot \lfloor b_2/k_2 \rfloor$ blocks of a product configuration are obtained as follows, with $\lfloor \ \rfloor$ denoted the largest integer less than or equal to the enclosed quantity, let the blocks from $B_1$ be grouped into $\lfloor b_1/k_1 \rfloor$ classes of $k_1$ blocks each, the first block in a product configuration is obtained as a $k_1k_2$-block of ordered pair of elements $((\alpha_1\beta_1), \ldots, (\alpha_1, \beta_{k2}), \ldots, (\alpha_{k1},\beta_1), \ldots, (\alpha_{k1},\beta_{k2}))$, with $\alpha_i$ ($i=1, \ldots, k_1$) belonging to the first block of $B_1$, and $\beta_i$ ($i=1, \ldots, k_2$) belonging to the first block in $B_2$ and the LDPC encoding comprises a first class code rate obtained by taking one block from the first class in $B_1$ at the time, and one block in $B_2$ out of the first $k_2$ blocks, and creating a product block.

8. The method of claim 7, wherein the LDPC encoding comprises a second class code rate obtained by observing next kI blocks in BI, and next k2 blocks in B2 and repeating the procedure until all blocks in either BI or B2 are exploited, or b blocks are generated, the blocks already used in creating the previous product blocks are excluded from further consideration and the product of P configurations can be defined iteratively by taking the product of two configurations in each step.

9. A method, comprising:
estimating quadrature amplitude modulated QAM symbols in an LDPC encoded OFDM signal for transmission;
performing channel estimation to determine channel estimates in reception of the LDPC encoded OFDM signal; and
determining an estimated QAM symbols as $$\hat{X}_{i,k} = (h_i^*/|h_i|^2)e^{-j\theta_i}e^{-j\phi_k}Y_{i,k},$$

where $h_i$ is channel distortion introduced by PMD and chromatic dispersion, and $\theta_1$ is the phase shift of i-th subcarrier due to chromatic dispersion, $\phi_k$ represents the OFDM symbol phase noise due to SPM and RF down-converter, and can be eliminated by pilot-aided channel estimation.

10. A method comprising the steps of:
performing channel estimation to determine channel estimates in a receiver of a
fiber optic communication system using LDPC coded OFDM;
estimating QAM symbols in a transmitter of the communication system; and obtaining channel information for use in detection and decoding in the communication system, wherein a λ-configuration, denoted as t-(v,k,{0, 1, . . . , λ}), is a collection of k-subsets (blocks) of a v-set V such that ever t-subset of V is contained in at most λ of the blocks and let $\lambda_1$- and $\lambda_2$-configurations, denoted as t-($v_1$,$k_1$,{0, 1, . . . , $\lambda_1$}) and t-($v_2$,$k_2$,{0, 1, . . . , $\lambda_2$}), be given, denote the number of blocks in $\lambda_1$ and $\lambda_2$-configurations by $b_1$ and $b_2$, respectively; and the corresponding set of blocks by $B_1$ and $B_2$, respectively the $v_1 v_2$-elements in the product configuration are ordered pair of elements ($e_1$,$e_2$), with $e_1$ belonging to $B_1$ and $e_2$ belonging to $B_2$, b=⌊$b_1$/$k_1$⌋·⌊$b_2$/$k_2$⌋ blocks of a product configuration are obtained as follows, with ⌊ ⌋ denoted the largest integer less than or equal to the enclosed quantity let the blocks from $B_1$ be grouped into ⌊$b_1$/$k_1$⌋ classes of $k_1$ blocks each the first block in a product configuration is obtained as a $k_1 k_2$-block of ordered pair of elements (($\alpha_1$,$\beta_1$), . . . , ($\alpha_1$,$\beta_{k2}$), . . . , ($\alpha_{k1}$,$\beta_1$), ($\alpha_{k1}$,$\beta_{k2}$)), with $\alpha_i$ (i=1, . . . , $k_1$) belonging to the first block of $B_1$ and $B_i$ (i=1, . . . , $k_2$) belonging to the first block in $B_2$ and the LDPC encoding comprises a first class code rate obtained by taking one block from the first class in $B_1$ at the time and one block in $B_2$ out of the first $k_2$ blocks and creating a product block.

11. The method of claim 10, further comprising the step of estimating bit reliabilities of a demapping of the received encoded OFDM signal.

12. The method of claim 10, wherein the estimated QAM symbols are related to the channel distortion introduced by fiber optical signals, phase shift of the QAM symbols due to chromatic dispersion and self-phase modulation.

13. The method of claim 10, wherein the step of obtaining channel information comprises determining bit log-likelihood ratios for LDPC decoding.

14. The method of claim 10, wherein the step of obtaining channel information comprises determining bit log-likelihood ratios for LDPC decoding and calculating extrinsic log-likelihood ratios.

15. The method of claim 10, wherein the step of obtaining channel information comprises i) determining bit log-likelihood ratios for LDPC decoding and ii) calculating extrinsic log-likelihood ratios till one of a parity check equation is satisfied and a predetermined number of iterations of i) and ii) have occurred.

16. The method of claim 15, comprising the step of using LDPC decoder extrinsic information for symbols log-likelihood ratios determination when one of a parity check equation is unsatisfied and a predetermined number of iterations of i) and ii) have not occurred.

* * * * *